(12) United States Patent
Watanabe et al.

(10) Patent No.: US 10,056,252 B2
(45) Date of Patent: Aug. 21, 2018

(54) PROCESS OF FORMING NITRIDE SEMICONDUCTOR LAYERS

(71) Applicant: SUMITOMO ELECTRIC DEVICE INNOVATIONS, INC., Yokohama, Kanagawa (JP)

(72) Inventors: Tadashi Watanabe, Kanagawa (JP); Hajime Matsuda, Kanagawa (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 0 days.

(21) Appl. No.: 15/686,755

(22) Filed: Aug. 25, 2017

(65) Prior Publication Data

US 2018/0061632 A1 Mar. 1, 2018

(30) Foreign Application Priority Data

Aug. 26, 2016 (JP) .................. 2016-166064
Jan. 16, 2017 (JP) .................. 2017-005207

(51) Int. Cl.
| | |
|---|---|
| *H01L 21/02* | (2006.01) |
| *H01L 21/687* | (2006.01) |
| *C23C 16/30* | (2006.01) |
| *C23C 16/458* | (2006.01) |
| *H01L 21/67* | (2006.01) |
| *H01L 29/10* | (2006.01) |
| *H01L 29/20* | (2006.01) |

(Continued)

(52) U.S. Cl.
CPC ........ *H01L 21/0254* (2013.01); *C23C 16/303* (2013.01); *C23C 16/458* (2013.01); *C23C 16/4583* (2013.01); *C23C 16/46* (2013.01); *H01L 21/0262* (2013.01); *H01L 21/02458* (2013.01); *H01L 21/67103* (2013.01); *H01L 21/68771* (2013.01); *H01L 21/68785* (2013.01); *H01L 29/1058* (2013.01); *H01L 29/2003* (2013.01); *H01L 29/205* (2013.01); *H01L 29/66462* (2013.01); *H01L 29/7787* (2013.01)

(58) Field of Classification Search
CPC ........... H01L 21/0254; H01L 21/02458; H01L 21/0262; H01L 21/67103; H01L 21/68785; H01L 29/1058; H01L 29/2003
See application file for complete search history.

(56) References Cited

U.S. PATENT DOCUMENTS

| | | | | |
|---|---|---|---|---|
| 2011/0244663 A1* | 10/2011 | Su | ............ | C23C 16/301 438/478 |
| 2013/0020581 A1* | 1/2013 | Teraguchi | ......... | H01L 21/02381 257/76 |
| 2015/0206785 A1* | 7/2015 | Miyashita | ........... | C23C 16/4585 117/88 |

FOREIGN PATENT DOCUMENTS

| | | |
|---|---|---|
| JP | 2000-294538 A | 10/2000 |
| JP | 2005-072196 A | 3/2005 |
| JP | 2010-269970 A | 12/2010 |

\* cited by examiner

*Primary Examiner* — Christine Enad
(74) *Attorney, Agent, or Firm* — Smith, Gambrell & Russell, LLP.

(57) ABSTRACT

A process of forming a semiconductor device by use of a MOCVD technique is disclosed. The semiconductor device, which is made of primarily nitride semiconductor materials, includes a GaN channel layer, an AlGaN barrier layer, and a GaN cap layer on a substrate. The barrier layer and the cap layer are grown under a gradient temperature condition where the upstream side of the substrate with respect to the flow of the MOCVD source gases is at a higher temperature as compared with the temperature at the downstream side of the substrate with respect to the flow of the source gases.

17 Claims, 8 Drawing Sheets

(51) Int. Cl.
*H01L 29/205* (2006.01)
*H01L 29/66* (2006.01)
*H01L 29/778* (2006.01)
*C23C 16/46* (2006.01)

PROCESS OF FORMING NITRIDE SEMICONDUCTOR LAYERS

CROSS REFERENCE TO RELATED APPLICATION

The present application claims the benefit of priority of Japanese Patent Application No. 2016-166064, filed on Aug. 26, 2016, and another Japanese Patent Application No. 2017-005207, filed on Jan. 16, 2017, which are incorporated herein by reference.

BACKGROUND OF THE INVENTION

1. Field of the Invention

The present invention relates to a process of forming a semiconductor substrate.

2. Background Arts

Epitaxial grown of semiconductor layers on a substrate forms a semiconductor substrate. For instance, a technique of metal organic chemical vapor deposition (MOCVD) may sequentially grow a nucleus layer and a nitride semiconductor layer on the substrate as disclosed in Japanese Patent Applications laid open No. 2005-072196 and 2000-294538. Formation of electrodes of a source, a drain and a gate on thus grown semiconductor substrate may form a transistor type of a filed effect transistor (FET).

However, thicknesses and compositions of the nitride semiconductor layers sometimes become non-uniform within a substrate. For instance, a thickness and an aluminum composition in aluminum gallium nitride (AlGaN) layer sometimes vary within the substrate, which makes performance of FETs in the substrate inhomogeneity. The present invention provides a technique to suppress the variation in the thickness and the composition of a nitride semiconductor layer epitaxially grown on the substrate.

SUMMARY OF INVENTION

An aspect of the present invention relates to a process of forming a semiconductor device that is primarily made of nitride semiconductor materials. The nitride semiconductor materials are grown by metal organic chemical vapor deposition (MOCVD) supplied with source gases. The MOCVD provides a susceptor with a circular shape having a center, a middle, and a periphery. Heaters are accompanied with those center, middle, and periphery of the susceptor for adjusting temperature distribution thereof. The source gases flow from the center to the periphery. The process includes steps of: (a) setting a substrate on the susceptor where the substrate has the upstream side locating the center of the susceptor and the downstream side locating the periphery each for the flow of the source gases; (b) growing a first semiconductor layer on the substrate, where the first semiconductor layer is made of one of aluminum gallium nitride (AlGaN), indium aluminum nitride (InAlN), and indium aluminum gallium nitride (InAlGaN); and (c) grown a second semiconductor layer on the first semiconductor layer, where the second semiconductor layer is made of nitride semiconductor material without aluminum.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF EMBODIMENT

Next, embodiment according to the present invention will be described as referring to accompanying drawings. In the description of the drawings, numerals or symbols same with or similar to each other will refer to elements same with or similar to each other without duplicating explanations.

Figure 1:
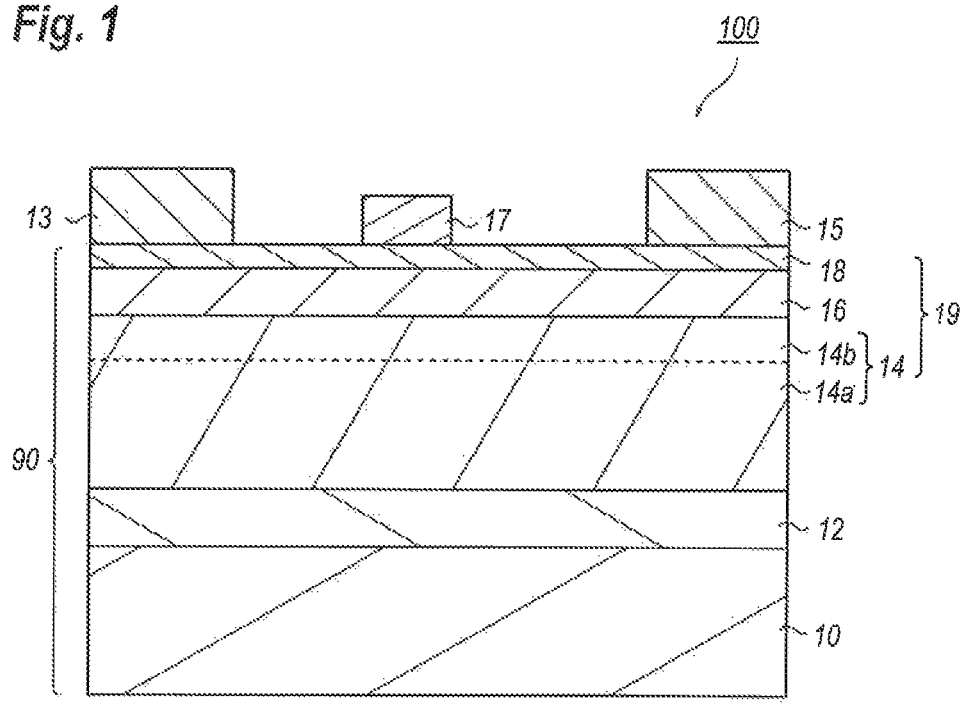
FIG. 1 schematically shows a cross section of a semiconductor device according to embodiment of the present invention.

An arrangement of a semiconductor device and an apparatus of the metal organic chemical vapor deposition (MOCVD) for producing the semiconductor device will be first described. FIG. 1 shows a cross section of the semiconductor device 100. The semiconductor device 100 of the embodiment includes a semiconductor layer 90 that includes a substrate 10, a buffer layer 12, a channel layer 14, a barrier layer 16, and a cap layer 18. The cap layer 18 provides a source electrode 13, a drain electrode 15, and a gate electrode 17 thereon. The substrate 10 may be made of, for instance, silicon carbide (SiC). The buffer layer 12 may be made of aluminum nitride (AlN) with a thickness of about 11 nm. The channel layer 14 may be made of un-doped gallium nitride (GaN) with a thickness of about 620 nm. The barrier layer 16 may be an n-type aluminum gallium nitride (n-AlGaN) with a thickness of about 21 nm. The cap layer 18 may be an n-type GaN with a thickness of about 5 nm. The source and drain electrodes, 13 and 15, may be formed by stacked metals of tantalum, aluminum, and tantalum (Ta/Al/Ta). The gate electrode 19 may be also formed by stacked metals of nickel, palladium, and gold (Ni/Pd/Au). The semiconductor device 100 thus configured operates as a field effect transistor (FET), more exactly, a high electron-mobility transistor (HEMT).

Figure 2A:
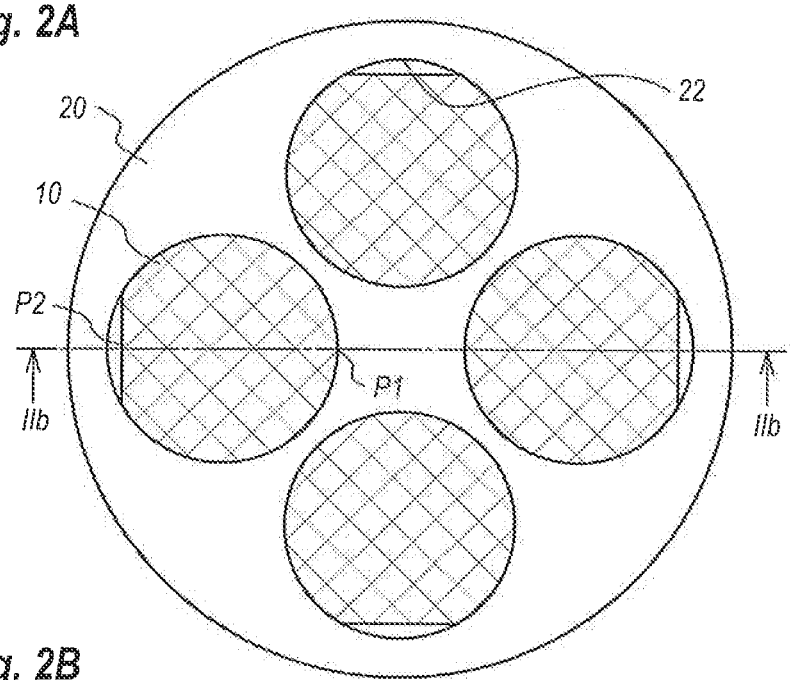
FIG. 2A is a plan view of a susceptor of the metal organic chemical vapor deposition (MOCVD) apparatus and FIG. 2B shows a cross section of the susceptor and a flow of the source gases, where the cross section is taken along the line IIb-IIb indicated in FIG. 2A.

FIG. 2A schematically shows a plan view of a susceptor 20 implemented within the MOCVD apparatus for growing the semiconductor layer 90, where FIG. 2A omits shower head through which source gases are supplied within the growth chamber. As FIG. 2A illustrates, the susceptor 20 provides pockets 22 arranged in center symmetry on the susceptor 20. Substrates 10 are set within the pockets 22 which are denoted as hatched areas in FIG. 2A such that sides P2 having orientation flats of the respective substrate 10 face outward while other sides P1 face inward. The substrate 20 may have a size of four (4) inches.

Figure 2B:
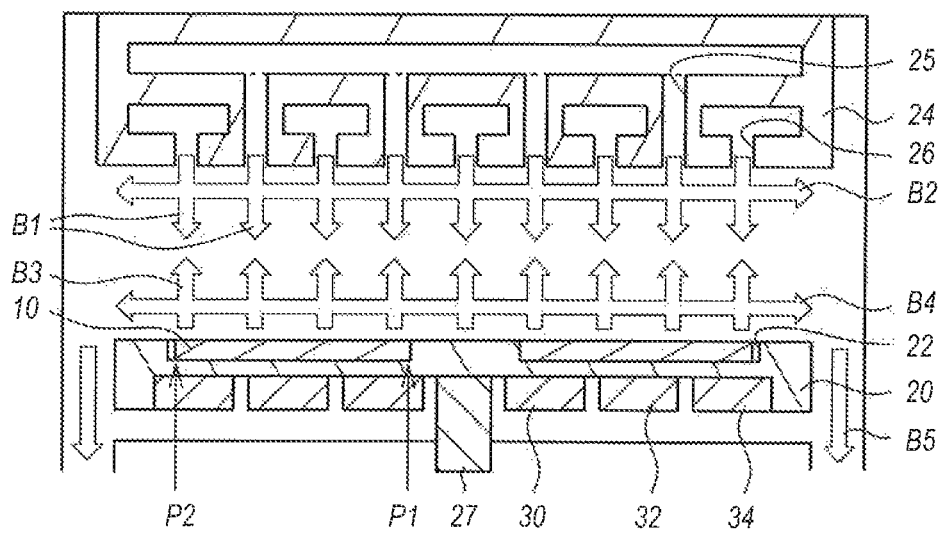

FIG. 2B shows a cross section of the susceptor 20 taken along the line IIb-IIb indicated in FIG. 2A, where FIG. 2B explicitly illustrates the shower head 24 and flows of the source gases. The susceptor 20 provides an axis 27 around which the susceptor 20 may rotate during the growth of the semiconductor layers. The shower head 24 is arranged above the susceptor 20. Heating the substrates 10 set within the pockets 22 of the susceptor 20 by activating heaters, 30 to 34, implemented in the susceptor 20 and concurrently, supplying source gases through holes, 25 and 26; the semiconductor layer 90 may be epitaxially growing on the substrate 10. One of holes 25 supply source gases for group III elements, typically gallium (Ga) and aluminum (Al), while, the other holes 26 supply a source gas for the group V element, namely, nitride (N).

The source gases, which jet through holes, 25 and 26, of the shower head 24, flow toward the susceptor 20 as arrows B1 indicates. A portion of the source gases flows outward and are exhausted to the outside of the growth chamber as arrows B2 indicate. Concurrently, semiconductor materials accumulated on surfaces of the susceptor 20 and the substrate 10 sublimate source gases as arrows B3 indicate. Also, as arrows B2 and B4 indicate, the sources gases flow from a center of the susceptor 20 to the peripheries, and exhausted to the outside of the growth chamber. Setting the substrates 10 within the pockets 22 in the susceptor 20 such that respective orientation flats face peripheries, the side P1 opposite to the orientation flat becomes the upstream side, and the other P2, the side of the orientation flat, becomes the downstream side with respect to the flow of the source gases.

Figure 3A:
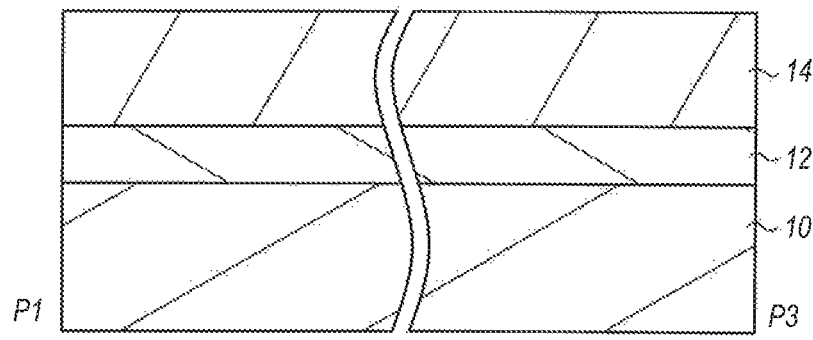
FIGS. 3A to 3C show steps of the process of growing the semiconductor layers on the substrate.

The semiconductor device 100 is formed as follows. First, the substrates 10 made of silicon carbide (SiC) are set within the respective pockets 22 of the susceptor 20 such that the orientation flats face peripheries as FIGS. 2A and 2B show. FIGS. 3A and 3C show cross sections of the semiconductor device 100 at respective processes. The MOCVD using the apparatus shown in FIGS. 2A and 2B may grow semiconductor layers of the AlN buffer layer 12, the GaN channel layer 14, the barrier layer 14, and the cap layer 16 sequentially on the SiC substrate 10.

When a substrate is set on the susceptor 20 without any compensations, semiconductor layer 90 grown on the substrate, in particular, the barrier layer 16 and the cap layer 18 vary thicknesses thereof. The barrier layer 16 and the cap layer 18 become thinner in a side P1 closer to the center of the susceptor 20 but become thicker in the other side of the periphery P2 of the susceptor 20. The source gases flow from the center of the susceptor 20 as denoted by the arrows, B2 and B4, in FIG. 2B. Accordingly, the thickness of the grown layer in the downstream side P2 of the substrate becomes thicker, while, that in the upstream side P1 becomes thinner. The variation in the thickness of the grown layer, in particular, the thickness variation in the barrier layer 16 causes large dispersion in the threshold voltage of the device. Also, the thickness variation in the cap layer 18 strongly affects the performance of the device because the cap layer 18 has a thickness of merely 5 nm.

The flow of the source gases also varies the compositions of grown layers. In particular, the aluminum composition in the barrier layer 16 disperses the bandgap energy of the semiconductor material. The aluminum composition of the barrier layer 16 becomes smaller at the upstream side P1 of the substrate 10 for the flow of the source gases, while, the aluminum composition becomes greater at the downstream side P2, which also disperses the performance of the device. Because the flow of the source gases and the pressure within the grown chamber are hard to be precisely adjusted, because those parameters fully depend on the arrangement of the MOCVD apparatus.

First Embodiment

Figure 3B:
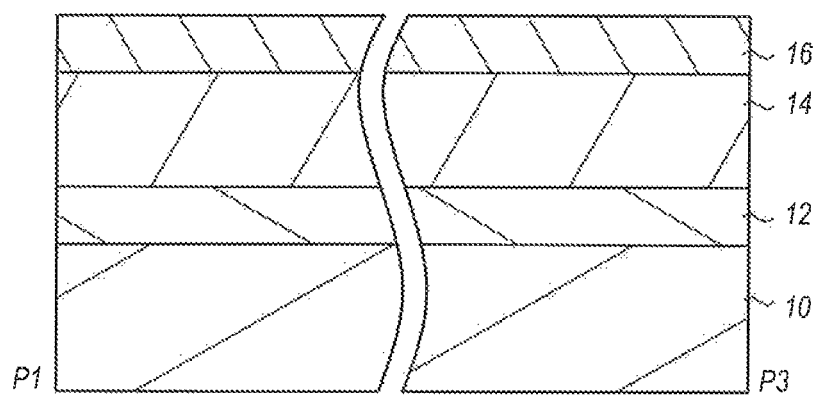
Figure 3C:
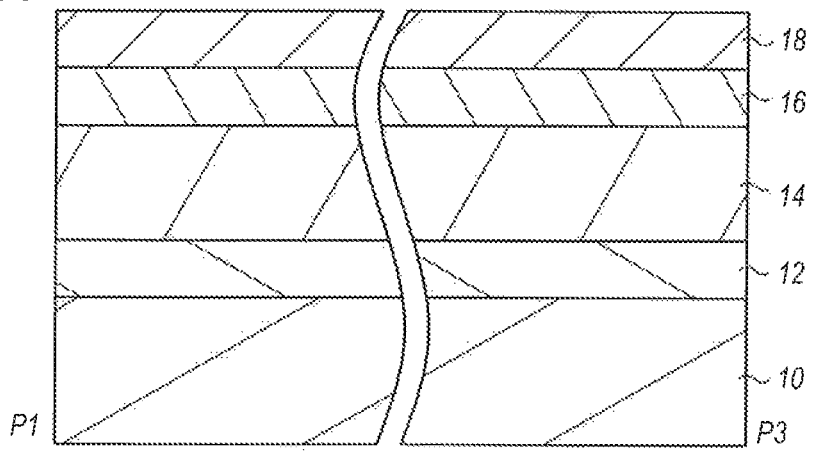

FIGS. 3A to 3C show processes of forming the semiconductor device according to the first embodiment of the present invention, where FIGS. 3A to 3C show cross sections of the semiconductor device at respective processes. Table 1 below summarizes conditions for forming the semiconductor device. As FIG. 3A shows, the process first grows the buffer layer 12 made of aluminum nitride (AlN) on the substrate 10 by a thickness of 11 nm, then the channel layer 14 made of gallium nitride (GaN) on the buffer layer 12 by a thickness of 620 µm. In table 1 below, symbols TMA, TMG, NH3, and SiH4 mean tri-methyl-aluminum, tri-methyl-gallium, ammonia, and silane, respectively. Also, one Torr in pressure is 133.3 Pa, 1 sccm corresponds to $1.667 \times 10^{-8}$ m$^3$/sec, and 1 slm corresponds to $1.667 \times 10^{-5}$ m$^3$/sec, respectively.

Grown on the channel layer 14 is a barrier layer 16 made of aluminum gallium nitride (AlGaN) by a thickness of 21 nm, which is shown in FIG. 3B. During the growth of the barrier layer 16, the temperature of the susceptor 20 is set relatively higher in a center thereof, which corresponds to the upstream side of the substrate 10 set in the pocket 22 for the flow of the source gases, while the periphery of the susceptor 20 is set relatively lower with respect to the center thereof, which corresponds to a downstream side of the substrate 10 set in the pocket 22 for the flow of the source gases. Specifically, a temperature gradient for the susceptor 20 is set where the center is set higher by about 7° C. with respect to the periphery thereof, namely, the center temperature of the susceptor 20 is set at 1063° C., while, the periphery thereof is set at 1056° C.

Then, the process grows the cap layer 18 on the barrier layer 16 by a thickness of about 5 nm, as shown in FIG. 3C. During the growth of the cap layer 18, the temperatures gradient of the susceptor 20, namely, the temperatures in the center and the periphery may be kept as those during the growth of the barrier layer 16. Only the conditions for the source gases are changed. The supply of TMA is ceased, and that of silane (SiH$_4$) is increased. Table 1 below summarizes the growth conditions of the semiconductor layers.

TABLE 1

Conditions for growing semiconductor layers at first embodiment

| Layer | thickness | pressure [Torr] | temperature [° C.] | source gases |
|---|---|---|---|---|
| buffer 12 | 11 nm | 100 | 1100 | TMA: 195 sccm NH$_3$: 30 slm |
| channel 14 | 620 µm | 100 | 1060 | TMG: 81 sccm NH$_3$: 22.5 slm |
| barrier 16 | 21 nm | 100 | center: 1063 middle: 1060 periphery: 1056 | TMG: 37 sccm TMA: 137 sccm NH$_3$: 22.5 slm SiH$_4$: 5.8 sccm |
| cap 18 | 5 nm | 100 | center: 1063 middle: 1060 periphery: 1056 | TMG: 63 sccm NH$_3$: 22.5 slm SiH$_4$: 22.4 sccm |

Figure 4:
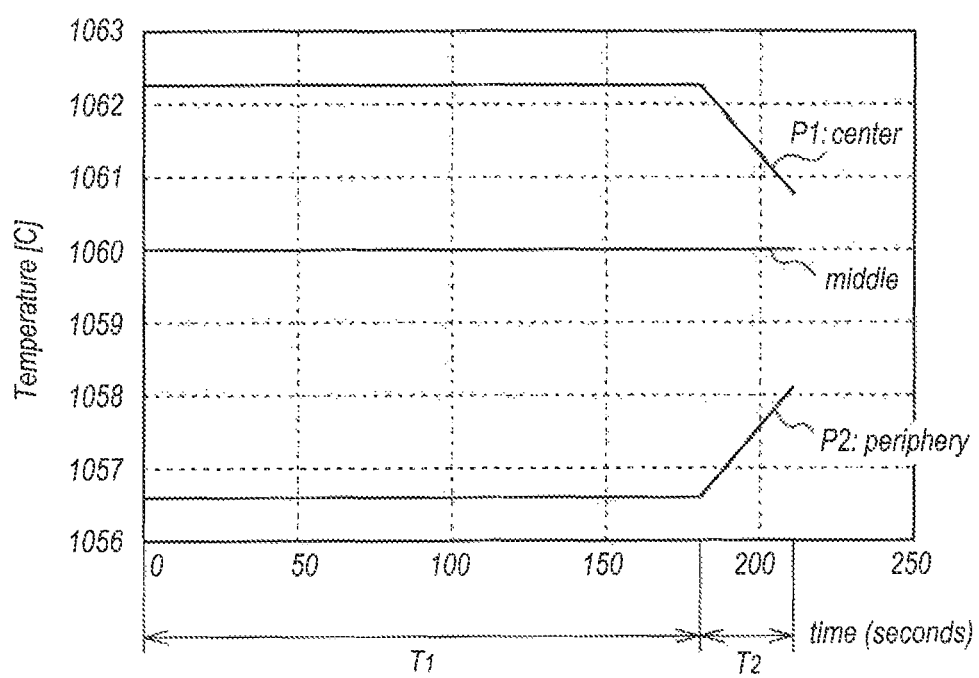
FIG. 4 schematically shows a time chart of a temperature gradient set for the growth of the barrier layer and the cap layer.

Referring to FIG. 4, a time chart of the temperatures of the susceptor 20 during the growth of the barrier layer 16 and the cap layer 18 is shown. The growth of the barrier layer 16 denoted as a period $T_1$ is carried out under constant temperatures and only the temperature gradient is set. Specifically, the center of the susceptor 20 is set between 1062° C. and 1063° C., the middle thereof is set at 1060° C., and the periphery thereof is set between 1056° C. and 1057° C. The temperature gradient, which is kept during the growth of the barrier layer 16, may enhance the capture of aluminum (Al) at the center of the susceptor 20 and suppress the dispersion of the aluminum composition in the barrier layer 16. The present embodiment concentrates a case where the barrier layer 16 is made of AlGaN, the spirit of the embodiment, that is, the dispersion of the compositions may be suppressed by the temperature gradient of the susceptor 20, may be applicable to other cases where the barrier layer is made of indium aluminum nitride (InAlN) and/or indium aluminum gallium nitride (InAlGaN). In such a barrier layer containing indium (In), the susceptor 20 in the periphery thereof is set between 700° C. to 800° C., and the center of the susceptor 20 is set higher than the periphery by 5° C. to 10° C.

The temperature gradient of the susceptor 20 is suppressed during the growth of the cap layer 18, which is denoted by $T_2$. That is, the center of the susceptor 20 is lowered from the growth temperature of the barrier layer 16 by about 1.5° C., the periphery of the susceptor 20 is increased by about 1.5° C., and the middle thereof is kept constant at 1060° C. The reason why the temperatures of the center, the periphery, and the middle are substantially the same during the growth of the barrier layer 16 is that, when the start temperatures are set for those adequate to grow a GaN layer, the aluminum composition at the end of the growth of the barrier layer 16, namely, the aluminum composition at the surface of the barrier layer 16 is varied. Gradual cancellation of the temperature gradient shown in FIG. 4 may be applied to cases where the barrier layer 16 includes indium (In), namely, the barrier layer 16 is made of InAlN and InAlGaN.

Figure 5:
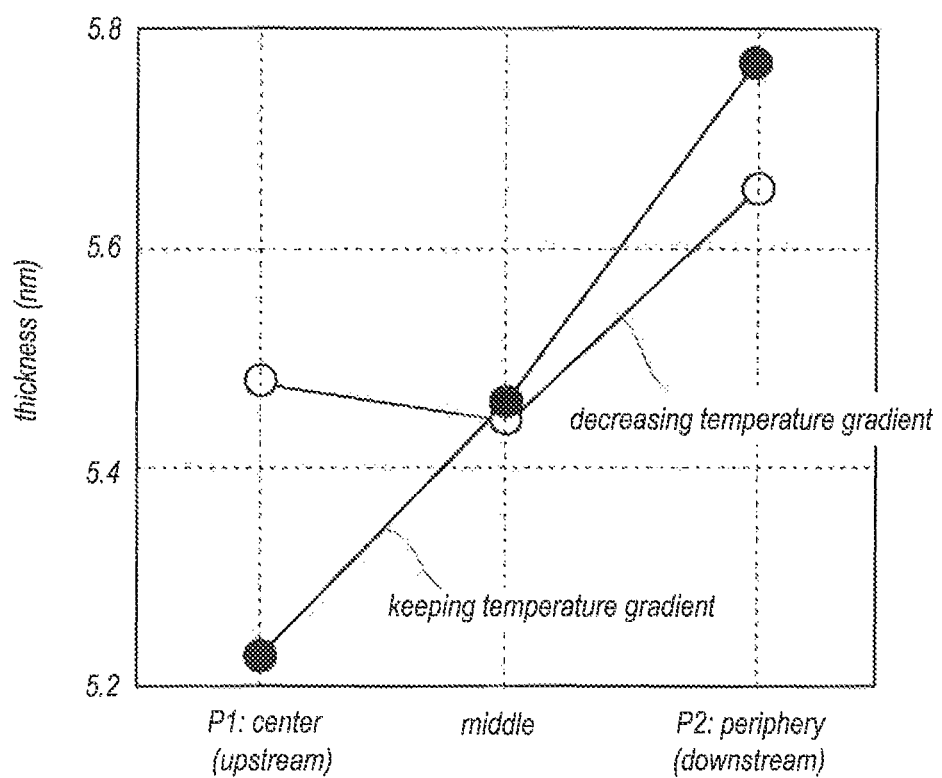
FIG. 5 shows behaviors of a thickness of the barrier layer grown with the temperature gradient and without the temperature gradient.

FIG. 5 shows dispersion in the thickness of the cap layer 18 within a substrate. When the gradual cancelation of the temperature gradient is done, the dispersion in the thickness of the cap layer 18 may be suppressed to about 0.2 nm between the center of the susceptor 20, the upstream side of the substrate 10 for the flow of the source gases, and the periphery of the susceptor 20, the downstream side of the substrate 10 for the flow of the source gases. On the other hand, when no gradual cancelation of the temperature gradient is done, the dispersion in the thickness of the cap layer 18 is left large, greater than 0.45 nm between the upstream side and the downstream side of the substrate 10. In particular, the reduction in the thickness in the upstream side of the substrate 10 is remarkable. The embodiment, by lowering the temperature in the center of the susceptor 20 during the growth of the cap layer 18, may effectively suppress the sublimation of the source gases thereat and enhance the growth of the layer 18. On the hand, the embodiment enhances the sublimation in the downstream side of the flow of the source gases for the substrate 10 and suppresses the growth of the layer 18. Because the dispersion in the thickness of the cap layer 18 may be suppressed, the performance of the FET, such as the dispersion in the threshold voltage thereof, may be suppressed.

In the growth of the barrier layer 16 made of AlGaN, the temperature gradient from the center to the periphery is set in the susceptor 20, that is, the temperature in the center is set higher than the temperature of the periphery of the susceptor 20 by 5 to 7° C., where the temperature of the middle of the susceptor 20 is set to be 1060° C. The center corresponds to the upstream side P1 in the flow of the source gases for the substrate 10, while, the periphery corresponds to the downstream side P2 of the flow of the source gases. The temperature gradient in the susceptor 20, namely, in the flow of the source gases may suppress the dispersion in the aluminum composition in the grown AlGaN barrier layer 16. Moreover, the temperature gradient in the susceptor 20 is suppressed during the growth of the GaN cap layer 18; that is the temperature in the center of the susceptor 20 is gradually cancelled during the growth of the cap layer 18, which may suppress the dispersion in the thickness of the cap layer 18. The present embodiment may solve the trade-off between the dispersion in the aluminum composition (Al) in the barrier layer 16 and the dispersion in the thickness of the cap layer 18, which makes the threshold voltage of the device uniform. When only the cap layer 18 in dispersion of the thickness thereof is necessary to be reduced, the cancelation of the temperature gradient is unnecessary during the growth of the cap layer 18. The adjustment of the temperatures in the center, middle, and peripheral of the susceptor 20 may be carried out before the practical growth of the cap layer 18.

The cap layer 18 of the embodiment has the thickness less than 5 nm. When a cap layer having such a smaller thickness causes substantial dispersion, the semiconductor device scatters in the performance thereof such the threshold voltage. The cap layer 18 of the present embodiment causes the dispersion in the thickness of merely 0.2 nm, which effectively suppresses the dispersion in the performance of the semiconductor device.

During the growth of the cap layer 18, the temperature gradient in the susceptor 20 may be gradually cancelled. Specifically, the temperature in the center of the susceptor 20 is gradually lowered by at least 1.5° C., while, the temperature of the periphery of the susceptor 20 is gradually increased by at least 1.5° C. This gradual cancelation of the temperature gradient may suppress the dispersion in the thickness of the cap layer 18.

The susceptor 20 may set four to seven pockets 22, that is, may set four to seven substrates 10 in the respective pockets 22. During the growth of the barrier layer 16, the susceptor 20 sets the temperature gradient from the center to the periphery thereof, that is the temperature in the center that corresponds to the upstream side for the flow of the source gases is higher than the temperature in the periphery that corresponds to the downstream side of the flow of the source gases. Also, during the growth of the cap layer 18, the temperature gradient in the susceptor 20 is gradually cancelled, that is, temperature difference between the center and the periphery of the susceptor 20 is smaller than the temperature difference therebetween during the growth of the barrier layer 16. Also, the temperature in the periphery of the susceptor 20 that corresponds to the downstream side for the flow of the source gases is higher than the temperature in the periphery during the growth of the barrier layer 16. Thus, the temperature gradient of the susceptor 20 during the growth of the barrier layer 16 and the cancelation of the temperature gradient during the growth of the cap layer may be operable for all substrate 10 set in the respective pockets 22 of the susceptor 20. The susceptor 20 of the embodiment provides four to seven pockets 22, but all pockets are unnecessary to be set with the substrate 10. Even when only on pocket 22 sets the substrate 10 therein, the substrate 10 may become a subject whose temperatures in the upstream side and the downstream side for the flow of the source gases may be adjusted and the barrier layer 16 in the aluminum composition thereof and the cap layer 18 in the thickness thereof may be suppressed in the dispersion thereof.

The cap layer 18 may be made of, in addition to GaN, indium nitride (InN), indium gallium nitride (InGaN), and so on. Even when the cap layer 18 is made of such materials, the cancelation of the temperature gradient in the susceptor 20 during the formation of the cap layer 18 may suppress the dispersion in the thickness thereof.

Second Embodiment

Figure 6:
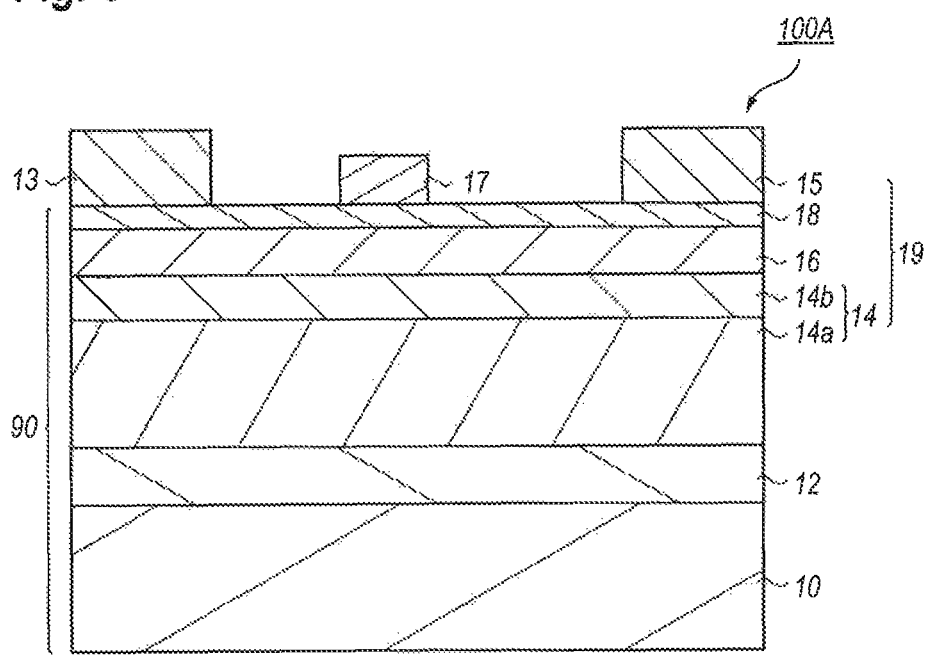
FIG. 6 schematically shows a cross section of another semiconductor device according to the second and the third embodiment of the present invention.

FIG. 6 shows a cross section of a semiconductor device 100A according to the second embodiment of the present invention. The semiconductor device 100A is a type of also, what is called, high electron mobility transistor (HEMT) including a semiconductor layer 90, a source electrode 13, a drain electrode 15, and a gate electrode 17. The semiconductor layer 90 includes a substrate 10, a buffer layer 11, hereinafter denoted as a buffer layer 12, a nitride semiconductor layers 19 that includes a GaN channel layer 14, a barrier layer 16, and a cap layer 18. The substrate 10 may be made of insulating material such as silicon carbide (SiC). A feature of the second embodiment distinguishable from the first embodiment is that the GaN channel layer 14, as described above, includes the first GaN layer 14a and the second GaN layer 14b, where the first GaN layer 14a is provided on the buffer layer 12, while, the second GaN layer 14b is provided on the first GaN layer 14a. The barrier layer 16 is provided on the second GaN layer 14b, and the cap layer 18 is provided on the barrier layer 16.

The substrate 10 may be made of silicon carbide (SiC). The buffer layer 12, which may be made of aluminum nitride (AlN), has a thickness of about 13 nm. The first GaN layer 14a has thickness of, for instance, 0.65 μm, while, the second GaN layer 14b has a thickness of 0.1 μm. These first and second GaN layers, 14a and 14b, may be made of un-doped GaN. The barrier layer 16, which may be made of aluminum gallium nitride (AlGaN), has a thickness of about 24 nm and the aluminum composition of around 0.22. The cap layer 18, which may be made of n-type GaN, has a thickness of about 5 nm. The source electrode 13 and the drain electrode 15 are formed by a stacked metal that stacks tantalum (Ta) with a thickness of 6 nm, aluminum (Al) with a thickness of 300 nm from a side of the cap layer 16 in this order, and another tantalum (Ta) with a thickness of 6 nm, and subsequent alloy. The gate electrode 17 also stacks metal layers of, from the side of the cap layer 18, a nickel (Ni) layer with a thickness of 60 nm, a palladium (Pd) layer with a thickness of 40 nm, a gold (Au) layer with a thickness of 350 nm, and a tantalum (Ta) layer with a thickness of 10 nm.

The temperature gradient of the susceptor 20 during the growth of the AlGaN barrier layer 16 may effectively suppress the dispersion in the aluminum composition in the barrier layer 16; however, the raised temperature in the center of the susceptor 20 may accelerate the dissociation of TMG, which is an organic metal and contains many carbon atoms; accordingly, suppresses the capture of carbon within the grown layer. Carbon (C) atoms behave as acceptors in nitride semiconductor materials. The reduction of the capture of the carbon atoms results in a relative increase of donors in the grown layer. Thus, a semiconductor layer grown at a higher temperature likely increases the leak current. Moreover, the growth at a higher temperature also likely enhances the capture of residual oxide and silicon atoms, where those atoms behave as donors in nitride semiconductor materials. Accordingly, the leak current is possibly further increased in a semiconductor layer grown at a relatively higher temperature.

The second embodiment according to the present invention grows two GaN layers, 14a and 14b, for the GaN layer 14, and during the growth of the second GaN layer 14b and the barrier layer 16, the temperature of the substrate in the upstream region for the flow of the source gases is set higher than the temperature of the substrate in the downstream region for the stream of the source gases.

Next, a process of forming the semiconductor device 110 according to the second embodiment of the present invention will be described. As FIGS. 2A and 2B indicate, the process fundamentally sets the SiC substrate 10 within a pocket of the susceptor 20 of the MOCVD apparatus and grows semiconductor layers thereon. Growth conditions according to the second embodiment are listed in table 2 below.

TABLE 2

Growth conditions for semiconductor layers of second embodiment

| layer | thickness | pressure [Torr] | temperature [° C.] | sources and flow rates |
|---|---|---|---|---|
| buffer 11 | 13 nm | 100 | 1100 | TMA: 130 sccm NH$_3$: 15slm |
| 1$^{st}$ GaN 14a | 0.65 μm | 120 | 1060 | TMG: 50 sccm NH$_3$: 20 slm |
| 2$^{nd}$ GaN 14b | 0.1 μm | 120 | | |
| barrier 16 | 24 nm | 120 | center: 1060 middle: 1060 periphery: 1055 | TMG: 40 sccm TMA: 140 sccm NH$_3$: 20 slm SiH$_4$: 6 sccm |
| cap 18 | 5 nm | 120 | | TMG: 60 sccm NH$_3$: 20 slm SiH$_4$: 22 sccm |

As listed in table 4 above, the growth temperature for the first GaN layer 14a is set uniform within a whole susceptor 20, which is, for instance, 1060° C. On the other hand, a temperature gradient is set for the growth of the second GaN layer 14b, that is, the center and the middle of the susceptor 20 are set higher than a temperature in the periphery of the susceptor 20, which corresponds to the downstream side in the substrate for the flow of the source gases. Specifically, the temperatures in the center and the middle of the susceptor 20 are set to be 1060° C., while, the periphery thereof is set to be 1055° C., lowered by 5° C. from that of the center and the middle. This temperature gradient in the susceptor 20 is maintained in the subsequent growth of the barrier layer 16 and the cap layer 18.

The process of the second embodiment first grows the buffer layer 12 on the substrate 10 at 1100° C. Then, the process changes the temperature and the pressure within the growth chamber of the MOCVD apparatus to be 1060° C. and 120 Torr, respectively. Supplying TMG with the flow rate of 50 sccm and ammonia (NH$_3$) with a flow rate of 20 slm, the process grows the first GaN layer 14a by the thickness of 0.65 μm. No temperature gradient is set in the growth of these two layers, 12 and 14a. Then, the process suspends the supplement of TMG but maintains the supplement of ammonia (NH$_3$) in order to suppress dissociation nitrogen (N) from the surface of the just grown first GaN layer 14a.

During the suspension of TMG, the process lowers the temperature to 1055° C. in the periphery of the susceptor 20, which corresponds to the downstream side of the substrate for the flow of the source gases, as maintaining the temperature to be 1060° C. in the center and the middle of the susceptor 20 corresponding to the upstream side of the substrate for the flow of the source gases by adjusting the power given to the heaters, 30 to 32. After the susceptor 20 stabilizes the temperature gradient, resuming the supplement of TMG as maintaining the supplement of ammonia (NH$_3$) by the flow rate of 20 slm, the process grows the second GaN layer 14b by a thickness of 0.1 µm. Subsequently, keeping the temperature gradient of the susceptor 20, the process sequentially grows the barrier layer 16 and the cap layer 18. Then, as shown in FIG. 6, the source, drain, and gate electrodes, 13, 15, and 17, are formed on the cap layer 18. Finally, the whole surface of the substrate including the electrodes, 13 to 17, is covered with an insulating film made of silicon nitride (SiN), which prevents water or moisture from invading into the semiconductor layers 19.

Figure 7A:
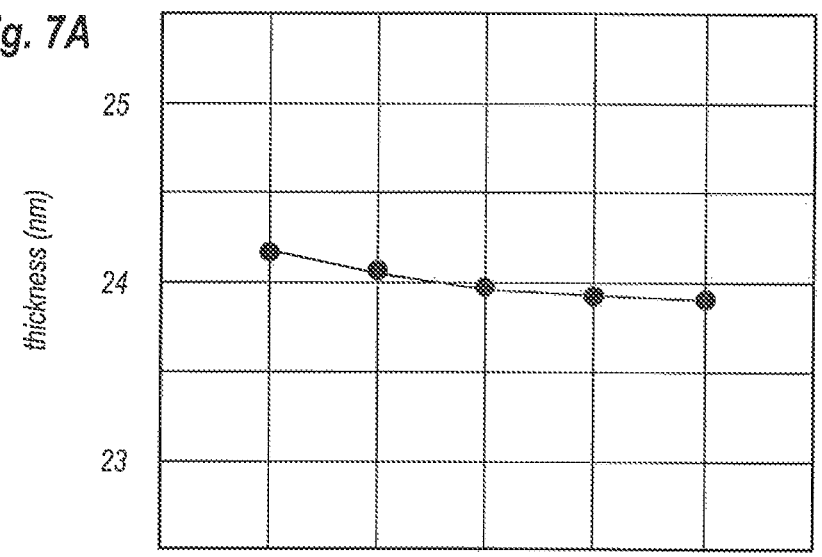
FIGS. 7A and 7B shows distribution of the thickness and the aluminum composition in the barrier layer grown under the temperature gradient.

Thickness of the barrier layer 16 and the aluminum composition therein were investigated by a specimen without electrodes, which is equivalently regarded as the semiconductor layer 90. FIG. 7A shows a variation in the thickness of the barrier layer 16 against the positions in the substrate 10. As shown in FIG. 7A, the thickness of the barrier layer 16 was slightly greater in the upstream side P1 of the substrate 10 compared with that in the downstream side P2 of the substrate 10 for the flow of the source gases. However, a difference in the thickness is smaller than 0.5 nm. That is, the second embodiment of the present invention may form the thickness of the barrier layer 16 in substantially uniform.

Figure 7B:
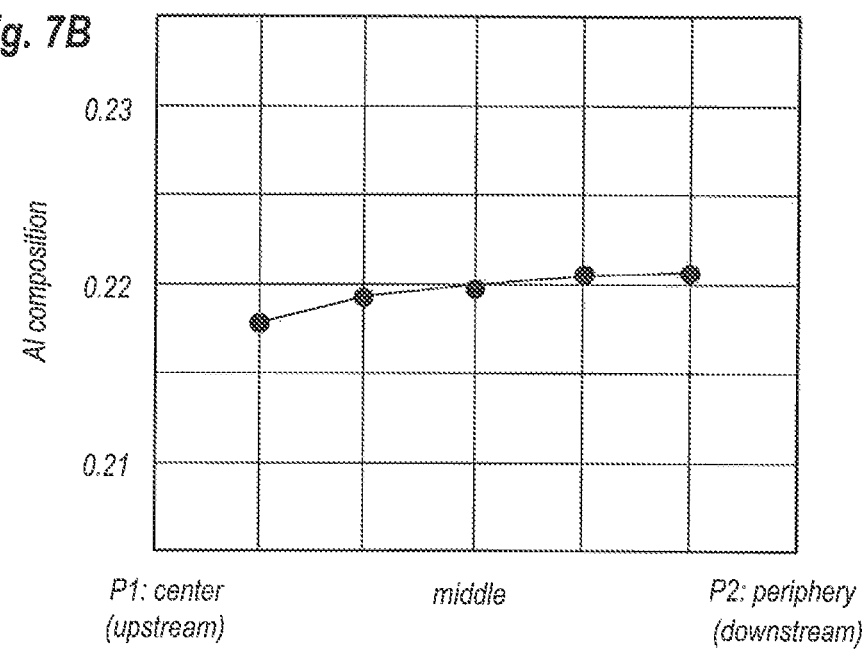

FIG. 7B shows a behavior of the aluminum composition in the barrier layer 16, where the aluminum composition was measured by the X-ray diffraction (XRD) technique. The aluminum composition in the barrier layer 16 becomes slightly smaller in the center of the susceptor 20, namely, in the upstream side P1 of the substrate for the flow of the source gases, compared with those in the middle and the periphery of the susceptor 20, namely in the downstream side P2 of the substrate 10 for the flow of the source gases. However, a difference in the aluminum composition between the center and the periphery is merely less than 0.005, which is comparable to a difference of 0.092 in a conventional case where no temperature gradient was set in the susceptor 20. Thus, the second embodiment may also enhance the uniformity of the aluminum composition in the barrier layer 16.

Figure 8:
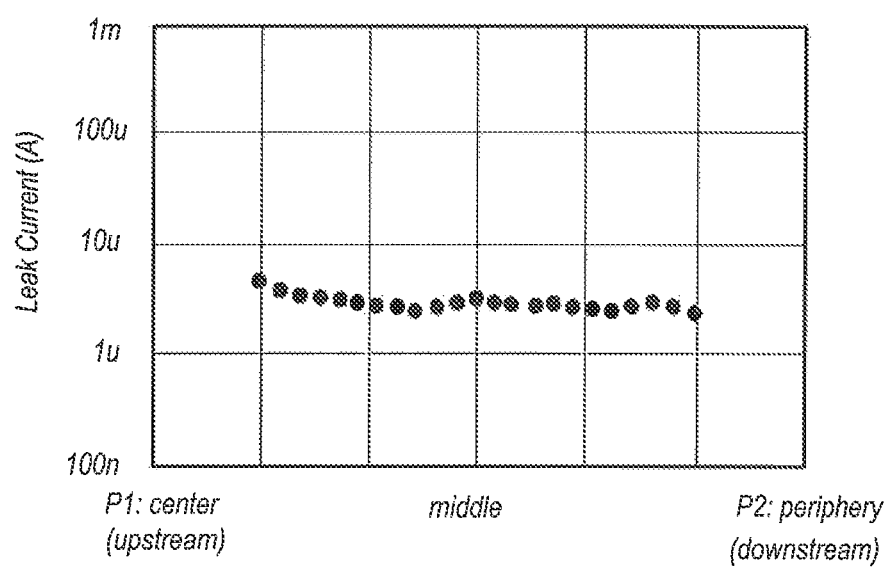
FIG. 8 shows a behavior of a leak current in the substrate.

FIG. 8 shows a behavior of the leak current within the substrate 10. As shown in FIG. 8, the leak current in the upstream region P1 of the substrate for the flow of the source gases considerably improved. Specifically, the leak current at the upstream side P1 is substantially comparable with the leak current at the downstream side P2. As FIGS. 7A to 8 explicitly show, the second embodiment according to the present invention may make the uniformity of the thickness and the aluminum composition in the barrier layer consistent with the reduction of the leak current in the channel layer 14.

In the second embodiment, the barrier layer 16 is grown under the temperature gradient condition; that is, the temperature of the susceptor 20 in the center thereof is set higher than the temperatures of the susceptor 20 in the middle and the periphery. Because the source gases are dense in the center of the susceptor 20, aluminum (Al) and nitrogen (N) form composites, which are easily exhausted outside of the growth chamber; and likely leave compounds of gallium nitride (GaN) on the substrate. However, the center of the susceptor 20, namely, the upstream side of the substrate 10 for the flow of the source gases, in the temperature thereof is set higher, which accelerates the dissociation of gallium nitride (GaN) and the capture of aluminum (Al). While, aluminum (Al) and nitrogen (N) are likely to be deposited on the substrate 10 in the middle and the periphery of the susceptor 20, namely, the downstream side of the substrate 10 for the flow of the source gases. Accordingly, the grown AlGaN barrier layer 16 becomes thinner and increases aluminum composition thereof in the center of the susceptor 20, namely, the upstream side of the substrate 10 for the flow of the source gases, compared with a case where no temperature gradient is set in the susceptor 20. Thus, as shown in FIGS. 7A and 7B, the thickness and the aluminum composition in the AlGaN barrier layer 16 becomes homogeneous within the substrate 10 compared with the case no temperature gradient is set.

The temperature gradient of the susceptor 20 is also applied to the growth of the second GaN layer 14b as shown in Table 1 above listed. The source gas of TMG, which includes many carbon atoms, is hard to be dissolved in a lower temperature, that is, in the middle and the periphery of the susceptor 20; accordingly, the grown GaN layer 14b likely captures carbon therein. Captured carbon easily diffuses within the grown layer, the second GaN layer 14b and increases the carbon concentration higher than that in the first GaN layer 14a. Carbon atoms may compensate donors, which mean that the leak current in the grown layer may be reduced as shown in FIG. 9. Accordingly, the temperature gradient set in the growth of the second GaN layer 14b and the barrier layer 16 may make the homogeneity in the thickness of the aluminum composition in the barrier layer 16 consistent with the reduction of the leak current in the GaN channel layer 14.

When the growth of the first GaN layer 14a sets a temperature gradient as those for the second GaN layer 14b and the barrier layer 16, the leak current in the GaN layers 14 may be further reduced. However, an excess carbon concentration in a grown layer may possibly cause a current drift. Specifically, carbon atoms iterate capture and release of electrons and holes during the operation of the semiconductor device in higher frequencies, which results in the current drift in the semiconductor device. Also, a growth of a semiconductor layer at a lower temperature may inevitably degrade quality of a grown layer. In particular, a gallium nitride (GaN) grown at relatively lower temperature easily causes pits on a surface of the grown layer. The pits caused in the first GaN layer 14a are easily reflected on a surface of the second GaN layer 14b grown on the first GaN layer 14b. Thus, another leak current due to the existence of the pits possibly increases.

In order to suppress the formation of the pits and resultantly decrease the current drift, the process may set the temperature gradient for the growth of the first GaN layer 14a smaller than the temperature gradient for the growth of the second GaN layer 14b. Accordingly, the first GaN layer 14a may have the carbon concentration smaller than that in the second GaN layer 14b, which effectively reduces not only the leak current but the current drift. The first GaN layer 14a also reduces pits in the surface thereof, which also suppresses pits in the second GaN layer 14b. The second GaN layer 14b may have the carbon concentration of $1.8 \times 10^{16}/cm^3$ but preferably greater than $2.0 \times 10^{16}/cm^3$; while, the first GaN layer 14a has the carbon concentration of $1.5 \times 10^{16}/cm^3$.

An average temperature for the growth of the second GaN layer 14b is set to be lower than an average temperature for the growth of the first GaN layer 14a. Thus, the second GaN layer 14b accelerates the capture of the carbon atoms C and increases the carbon concentration therein. Because the carbon concentration in the first GaN layer 14a is smaller than that in the second GaN layer 14b, not only the leak current in the second GaN layer effectively reduces but the current drift in the first GaN layer 14a may be effectively suppressed. The higher growth temperature for the first GaN layer 14a may effectively suppresses the pits therein.

In the growth of the second GaN layer 14b in the second embodiment of the present inventions, the growth temperature in the center of the susceptor 20 corresponding to the upstream side of the substrate 10 for the flow of the source gases is set to be 1060° C., which is equal to the growth temperature of the first GaN layer 14a, while, the middle and the periphery of the susceptor 20, namely, in the downstream side of the substrate 10 for the flow of the source gases, are set lower than the temperature above, which means the second GaN laser 14b may increase the carbon concentration and reduce the leak current.

As table 1 above indicates, the growth temperature is changed after the growth of the first GaN layer 14a but maintained after the growth of the second GaN layer 14b; that is, the growth temperatures including the temperature gradient are maintain between the growth of the second GaN layer 14b and that of the barrier layer 16. That is, the center of the susceptor 20, namely, the upstream side of the substrate 10 for the flow of the source gases are kept constant to be 1060° C. during the formation of the GaN layer 14 and the barrier layer 16, but the temperature of the middle and the periphery of the susceptor 20, which corresponds to the downstream side of the substrate 10 for the flow of the source gases is changed after the growth of the first GaN layer 14a but before the growth of the second GaN layer 14b.

A GaN layer 14 with an enough total thickness possibly increases the current drift. The embodiment of the present invention makes the first GaN layer 14a thicker than the second GaN layer 14b. Because the second GaN layer 14b has the carbon concentration smaller than that in the first GaN layer 14a, the current drift may be effectively suppressed. Also, the first GaN layer causes lesser pits in the surface thereof because of a relatively higher growth temperature thereof combined with the enough thickness thereof. The first GaN layer 14a preferably has a thickness of 0.5 μm or greater.

As described, the growth of the second GaN layer 14b and the barrier layer 16 is carried out under the temperature gradient of the susceptor 20. That is, the center of the susceptor 20, which corresponds to the upstream side of the substrate 10 for the flow of the source gases, is set higher than that of the middle and the periphery of the susceptor 20 during the growth of those layers, 14b and 16, by about 5° C. Accordingly, the barrier layer 16 makes the aluminum composition and the thickness thereof homogenous in the whole substrate 10. The dispersion in the performance in the device, such as the threshold voltage, the saturation current, and so on may be suppressed. Also, the second GaN layer 14b enhances the carbon concentration therein, which effectively suppresses the leak current. The temperature gradients in the growth of those two layers, 14b and 16, are preferably greater than 5° C. but less than 15° C. An excess temperature gradient becomes an over compensation, where the aluminum composition and the thickness of the barrier layer 16, and the carbon concentration in the second GaN layer 14b cause greater dispersion.

When the substrate 10 is set on the susceptor 20 of the MOCVD apparatus, the source gases flow from one side of the substrate 10, namely, the center of the susceptor 20, to the other side of the substrate 10, namely, the periphery of the susceptor 20. The temperature distribution on the susceptor 20 may be set by adjusting the power supplied to the heaters, 30 to 32. The temperature gradient indicated in table 1 may be obtained. Because the susceptor 20 may receiver four to seven substrates 10 in the respective pockets 22, respective substrates 10 may concurrently grow two GaN layers, 14a and 14b, and the barrier layer 16 that has a homogeneous thickness and an aluminum composition, and also the semiconductor device with a reduced leak current.

A lower growth pressure may enhance the capture of carbon atoms within the grown layer. The first and second GaN layers, 14a and 14b, and the barrier layer 16 are grown within the pressure equal to each other, which may suppress an excess capture of carbon atoms within the second GaN layer 14b and reduces the leak current therein.

Third Embodiment

The third embodiment according to the present invention sets the temperature gradient of the susceptor 20, where the center of the substrate 20, namely, the upstream side of the substrate 10 for the flow of the source gases, in a temperature thereof is higher than a temperatures of the middle and the periphery of the susceptor 20, namely, the downstream side of the substrate 10 for the flow of the source gases, during the growth of the second GaN layer 14b and the barrier layer, and the growth pressure of the second GaN layer 14b is set lower than the growth pressure for the first GaN layer 14a.

A process of forming a semiconductor device according to the third embodiment of the present invention will be described. Table 3 below summarizes the growth conditions for the respective layers. As table 2 indicates, the first GaN layer 14a is grown under substantially no temperature gradient of the susceptor 20, which may be 1060° C. While, the second GaN layer 14b is grown under the temperature gradient by 5° C. between the center and the middle, and the periphery of the susceptor 20. Moreover, a feature of the third embodiment is that the growth temperature of the center of the susceptor 20 is set higher than the growth temperature for the first GaN layer 14a that is homogeneous in a whole substrate 10. Also; the growth pressure for the first GaN layer 14a, which is 120 Torr, is set higher than the growth pressure for the second GaN layer 14b and the barrier layer 16, which is 100 Torr.

TABLE 3

Growth conditions for semiconductor layers of third embodiment

| layer | thickness | pressure [Torr] | temperature [° C.] | sources and flow rates |
|---|---|---|---|---|
| buffer 11 | 13 nm | 100 | 1100 | TMA: 130 sccm NH$_3$: 15 slm |
| 1$^{st}$ GaN 14a | 0.65 μm | 120 | 1060 | TMG: 50 sccm NH$_3$: 20 slm |
| 2$^{nd}$ GaN 14b | 0.1 μm | | | TMG: 50 sccm NH$_3$: 20 slm |
| barrier 16 | 24 nm | 100 | center:1065 middle: 1060 periphery: 1060 | TMG: 40 sccm TMA: 140 sccm NH$_3$: 20 slm SiH$_4$: 6 sccm |
| cap 18 | 5 nm | | | TMG: 60 sccm NH$_3$: 20 slm SiH$_4$: 22 sccm |

The process of forming the semiconductor device according to the third embodiment will be described. First, the nucleus layer 11 made of aluminum nitride (AlN) is grown on the substrate 10 by setting a temperature of the substrate 10, namely, temperatures in the center, the middle, and the periphery are set to be 1060° C. Supplying TMG by a flow rate of 50 sccm and ammonia (NH$_3$) of 20 slm, the first GaN layer 14a is grown on the buffer layer 12. After the growth of the first GaN layer 14a, the temperature of the center of the susceptor 20 is raised to 1065° C. but the middle and the periphery thereof are maintained in 1060° C. Also the growth pressure is reduced to 100 Torr. After the temperature and the pressure stabilize, the source gases of TMG and NH$_3$ are supplied within the growth chamber by flow rates of 50 scam and 20 slm, respectively, which are same conditions for the first GaN layer 14a, to grow the second GaN layer 14b. Thereafter, maintaining the temperature gradient of the susceptor 20 and the growth pressure but changing the gas sources, the barrier layer 16 and the cap layer 18 are sequentially grown on the second GaN layer 14b.

According to the third embodiment, the barrier layer 16 has the aluminum composition and the thickness homogeneous within the substrate 10, because the temperature gradient is set in the susceptor 20, where the center thereof that corresponds to the upstream side of the substrate for the flow of the source gases, is set higher than temperatures except for the center. Also, the second GaN layer 14b enhances the capture of carbon atoms compared with the first GaN layer 14a during the growth thereof because the growth pressure is lower than that for the first GaN layer 14a. The second GaN layer may have the carbon concentration of greater than $1.8 \times 10^{16}$ cm$^{-3}$. Accordingly, the carbon atoms in the second GaN layer 14b behave as acceptors and compensate donors, resultantly, decreases the leak current therein. Thus, the process according to the third embodiment makes the homogeneity of the aluminum composition and the thickness in the AlGaN barrier layer 16 consistent with the reduction of the leak current in the GaN channel layer 14.

In a case where the first GaN layer 14a and the second GaN layer 14b are grown under the same pressure, for instance, 100 Torr, a device formed thereby possibly causes the current drift because the carbon concentration likely rises in a whole GaN layer 14. Accordingly, the third embodiment lowers the growth pressure only for the second GaN layer 14b, and raises or keeps the growth pressure in relatively higher condition for the first GaN layer 14a. Thus, the first GaN layer 14a may have the carbon concentration relatively lower compared with that in the second GaN layer 14b; accordingly, the current drift may be effectively prevented or at least suppressed. The growth pressure for the second GaN layer 14b may be 110 Torr or lower when the growth pressure of the first GaN layer 14a is set to be 100 Torr.

The temperature gradient set in the susceptor 20 during the growth of the second GaN layer 14b, the barrier layer 16, and the cap layer 18 is about 5° C., that is, the center of the susceptor 20, which corresponds to the upstream side in the substrate 10 for the flow of the source gases, in the temperature thereof is set higher by 5° C. against the middle and the periphery of the susceptor 20 that correspond to the downstream side in the substrate 10 for the flow of the source gases, where the temperatures in the middle and the periphery are maintained from the growth of the first GaN layer 14a. Accordingly, the second GaN layer, in particular, the upstream side in the substrate 10 for the flow of the source gases is prevented from capturing excess carbon atoms during the growth. Resultantly, the current drift of the device may be suppressed.

In the foregoing embodiment, the semiconductor device 19 may be covered with an inorganic film such as silicon nitride (SiNx), silicon oxide (SiOx), silicon oxy-nitride (SiON), and so on to enhance against invasion of moisture and/or water into the device 19. Also, the semiconductor device 19 is not restricted to those FETs and HEMTs. Other types of the device may be similarly applied with the present invention. Electrodes are not restricted to those of the source, the drain, and the gate. That cap layer 18 is not restricted to the GaN layer and the AlGaN layer. Semiconductor materials containing nitrogen (N), such as indium gallium nitride (InGaN), indium nitride (InN), indium aluminum nitride (InAlN), indium aluminum gallium nitride (InAlGaN), are applicable for the cap layer 18. Also, the substrate 10 may include, except for silicon carbide (SiC), silicon (Si), sapphire (Al$_2$O$_3$), and gallium nitride (GaN).

While particular embodiment of the present invention has been described herein for purposes of illustration, many modifications and changes will become apparent to those skilled in the art. Accordingly, the appended claims are intended to encompass all such modifications and changes as fall within the true spirit and scope of the invention.

What is claimed is:

1. A process of forming a semiconductor device primarily made of nitride semiconductor materials grown by a metal organic chemical vapor deposition (MOCVD) supplied with source gases, the MOCVD providing a susceptor with a circular shape having a center, a middle, and a periphery each accompanied by heaters for adjusting temperature distribution of the susceptor, the source gases flowing from the center to the periphery of the susceptor, the process comprising steps of:
    setting a substrate on the susceptor, the substrate having an upstream side in the center and a downstream side in the periphery;
    growing a first semiconductor layer on the substrate, the first semiconductor layer being made of at least one of aluminum gallium nitride (AlGaN), indium aluminum nitride (InAlN), and indium aluminum gallium nitride (InAlGaN); and
    growing a second semiconductor layer on the first semiconductor layer, the second semiconductor layer being made of nitride semiconductor material without aluminum,
    wherein the first semiconductor layer is grown under conditions of a temperature gradient in which the center of the susceptor is set at a temperature higher than temperatures of the middle and the periphery of the susceptor, and
    wherein the second semiconductor layer is grown under a temperature gradient condition in which the temperature gradient for growing the second semiconductor layer is smaller than the temperature gradient for growing the first semiconductor layer.

2. The process of claim 1,
    wherein, in the step of growing the second semiconductor layer, the temperature of the periphery of the susceptor is higher than the temperature of the periphery of the susceptor during the growth of the first semiconductor layer.

3. The process of claim 1,
    wherein the first semiconductor layer is made of AlGaN, and
    wherein the temperature gradient for growing the first semiconductor layer includes conditions in which the temperature of the susceptor is 1055 to 1065° C. and the temperature of the center is higher than the temperature of the periphery by 5 to 7° C.

4. The process of claim 1,
    wherein the first semiconductor layer is made of one of InAlN and InAlGaN, and wherein the temperature gradient for growing the first semiconductor layer includes conditions in which the temperature of the periphery of the susceptor is from 700 to 800° C. and the temperature of the center is higher than the temperature of the periphery by 5 to 10° C.

5. The process of claim 1,
wherein the temperature gradient for growing the second semiconductor layer gradually decreases, the temperature of the middle being maintained at a temperature under the temperature at which the first semiconductor layer is grown.

6. The process of claim 5,
wherein the temperature of the center of the susceptor is decreased by at least 1.5° C. from the temperature thereat when the first semiconductor layer is grown, and the temperature of the periphery is raised by at least 1.5° C. from a temperature thereat when the first semiconductor layer is grown.

7. The process of claim 5,
wherein the second semiconductor layer is grown by 5 nm at most.

8. The method of claim 1, further including steps of sequentially growing a first channel layer and a second channel layer each made of gallium nitride (GaN) before the step of growing the first semiconductor layer,
wherein the first channel layer is grown under conditions of no temperature gradient and the second channel layer is grown under conditions of a temperature gradient where the temperature of the center of the susceptor is set higher than temperatures of the middle and the periphery of the susceptor.

9. The method of claim 1,
further including steps of sequentially growing a first channel layer and a second channel layer each made of gallium nitride (GaN) before the step of growing the first semiconductor layer,
wherein the first channel layer is grown under conditions of a temperature gradient that is smaller than a temperature gradient for growing the second channel layer, where the temperature gradient is measured from the center of the susceptor toward the periphery of the susceptor that is at a lower temperature than the center.

10. The method of claim 8,
wherein the second channel layer is grown under an average temperature of the susceptor that is lower than an average temperature of the susceptor for growing the first channel layer.

11. The method of claim 8, wherein, in the growth of the second channel layer,
the temperature of the center of the susceptor is maintained at a temperature for growing the first channel layer, and
the temperatures of the middle and the periphery of the susceptor are set lower than temperatures of the middle and the periphery of the susceptor for growing the first channel layer.

12. The method of claim 8,
wherein the second channel layer is grown at a pressure lower than a pressure for growing the first channel layer.

13. The method of claim 8, further including a step of, after the step of growing the first channel layer but before the step of growing the second channel layer,
suspending supplement of source gases; and
lowering the temperatures of the middle and the periphery of the susceptor to temperatures at which the second channel layer is grown from the temperatures of the middle and the periphery of the susceptor for growing the first channel layer.

14. The method of claim 8, further including a step of, after the step of growing the first channel layer but before the step of growing the second channel layer,
suspending supplement of source gases for a group III element but maintaining supplement of source gases for a group V element; and
raising the temperature of the center of the susceptor to a temperature at which the second channel layer is grown from the temperature of the center of the susceptor for growing the first channel layer.

15. The method of claim 8,
wherein the second channel layer is grown thinner than the first channel layer.

16. The method of claim 8,
wherein the temperature gradient for growing the second channel layer is at least 5° C.

17. The method of claim 8,
wherein the first semiconductor layer is grown under a temperature gradient that is substantially the same as the temperature gradient for growing the second channel layer.

* * * * *